United States Patent [19]

Chang et al.

[11] 4,006,425
[45] Feb. 1, 1977

[54] DIELECTRIC IMAGE GUIDE INTEGRATED MIXER/DETECTOR CIRCUIT

[75] Inventors: Yu-Wen Y. Chang, Los Alamitos; Hiromu J. Kuno; Pei Y. Chao, both of Rancho Palos Verdes, all of Calif.

[73] Assignee: Hughes Aircraft Company, Culver City, Calif.

[22] Filed: Mar. 22, 1976

[21] Appl. No.: 669,054

[52] U.S. Cl. .............................. 329/160; 325/445; 329/205 R; 331/96; 331/107 R; 333/84 R

[51] Int. Cl.² ..................... H03D 9/02; H01P 3/20

[58] Field of Search .......... 325/445, 449; 329/160, 329/161, 203–206; 330/4.9, 5; 331/96, 107 G, 107 R; 333/84 R, 84 M; 350/96 WG

[56] References Cited

UNITED STATES PATENTS

| | | | |
|---|---|---|---|
| 3,668,553 | 6/1972 | Dunn et al. | 333/84 M X |
| 3,680,002 | 7/1972 | Quine | 333/84 M X |
| 3,868,594 | 2/1975 | Cornwell et al. | 333/84 M X |

*Primary Examiner*—Paul L. Gensler
*Attorney, Agent, or Firm*—William J. Bethurum; W. H. MacAllister

[57] ABSTRACT

Disclosed is a dielectric image guide integrated circuit including first and second sections of image guide of preselected cross-sectional areas joined by an image guide transition section of variable cross-sectional area and all mounted on the surface of an image or ground plane. The image guide transition section has a cavity therein for receiving microwave/millimeter wave energy from the first section of the image guide, and this energy is coupled into a diode mounted within the cavity where it is either detected or frequency converted by the diode. Advantageously, the diode may be mounted on a metal cover which is positioned atop the cavity in the waveguide transition section, and it receives its operating bias from a bias pin connection extending through an opening in the ground plane and including a wisker contact to the diode.

10 Claims, 5 Drawing Figures

U.S. Patent Feb. 1, 1977 Sheet 2 of 2 4,006,425
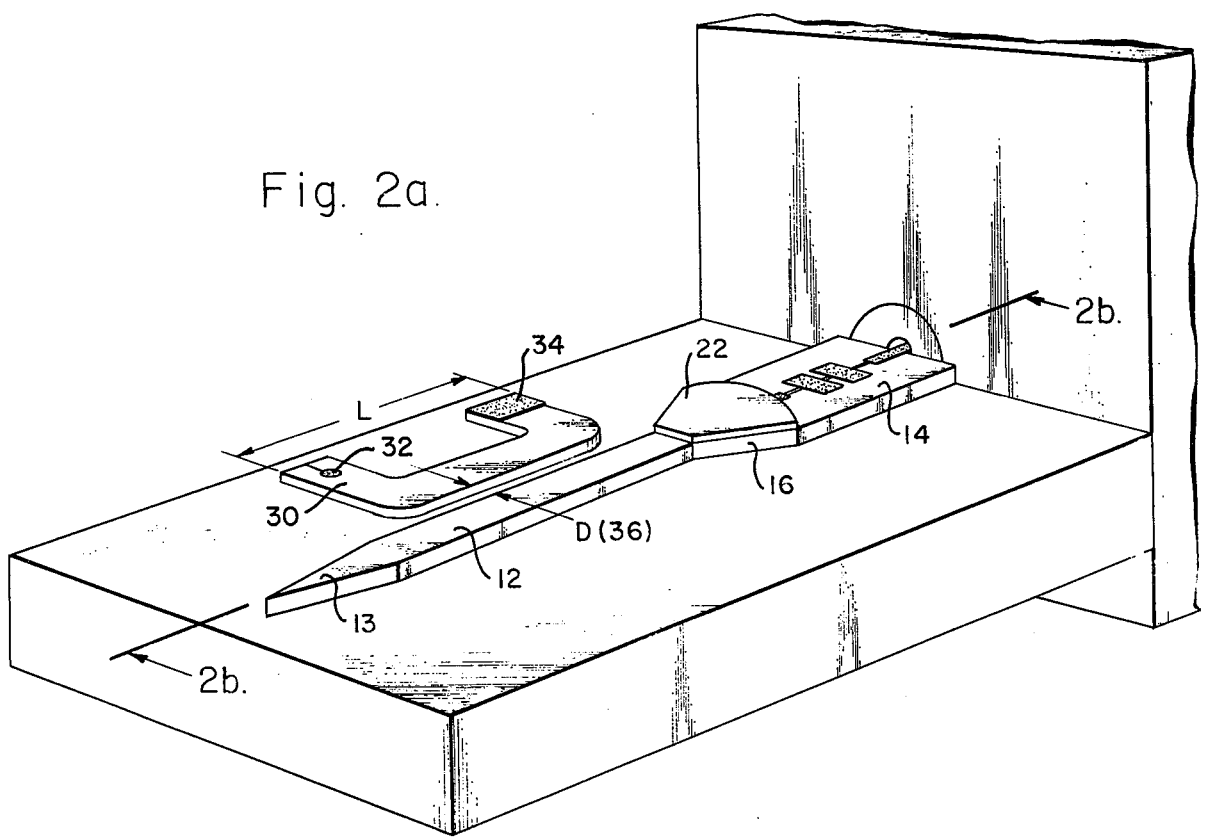
Fig. 2a.
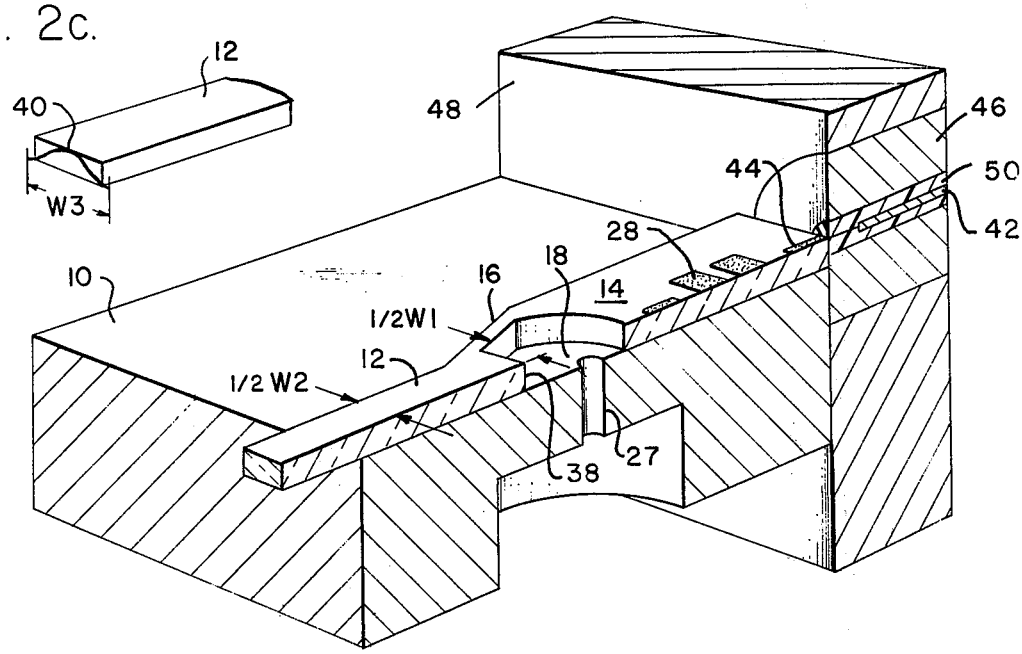
Fig. 2c.
Fig. 2b.

DIELECTRIC IMAGE GUIDE INTEGRATED MIXER/DETECTOR CIRCUIT

FIELD OF THE INVENTION

This invention relates generally to millimeter wave integrated circuits and more particularly to such circuits utilizing the so called "dielectric image guide" to sustain millimeter wave propagation and provide frequency mixing and detection thereof.

BACKGROUND AND RELATED APPLICATION

The dielectric image waveguiding structure is generally known in the microwave industry and includes a rectangular strip of either a dielectric material or high resistivity semiconductive material of predetermined rectangular cross section and mounted on a metal ground plane (also referred to as an "image plane") of infinite area. The dielectric or semiconductive rectangular strip is generally referred to in the art as the image guide and is useful for coupling microwave or millimeter wave energy from point to point on the ground or image plane. This image guide requires no surface metallization to control or confine the propagation of energy within the image guide, as in the case, for example, of the stripline or microstrip type of waveguide structures. The dielectric image structure of the type disclosed herein was disclosed as early as 1958 in an article by S. P. Schlesinger et al entitled "*Dielectric Image Lines*", IRE Transactions on Microwave Theory and Techniques, July 1958, at page 29 et seq. Further examples of such image guide structures are disclosed in FIG. 1c of U.S. Pat. No. 3,903,488 and in our copending application Ser. No. 632,613 filed Nov. 14, 1975, and also by E. A. J. Marcatili in an article entitled "Dielectric Rectangular Waveguide and Directional Coupler for Integrated Optics", *The Bell System Technical Journal*, September 1969, at page 2071 et seq.

The dielectric image guide of the above type is particularly useful in sustaining the fundamental $E_y^{11}$ mode of millimeter wave propagation in the millimeter wave frequency range of 30 to 300 GHz. The particular cross section height and width dimensions of the image guide are, of course, dependent upon the particular frequency or frequency range of interest within the above 30 to 300 GHz range. That is, the specific contour of the electric (E) field of this $E_y^{11}$ fundamental mode of wave propagation will vary with frequency, so that the height and width dimensions of the image guide can be tailored to correspond to a particular E-field contour and thereby provide the most efficient transmission of microwave or millimeter wave energy within the image guide.

In certain millimeter wave integrated circuit applications, it is desirable to provide frequency mixing and conversion or detection of the energy propagated in the image guide, and it is generally known that mixer diodes can be mounted in the path of the energy propagated in the image guide to provide either or both of these two functions. For example, when a mixer or detector diode is so mounted and connected in a known detector circuit, it will function to develop an output voltage which is proportional to the input power received from the image guide.

PRIOR ART

In a final report by R. M. Knox et al entitled "Investigation of the Use of Microwave Image Line Integrated Circuits for Use in Radiometers and Other Microwave Devices in X-Band and Above", Final Report, NASA CR-112107, August, 1972, there is disclosed an image guide integrated circuit in which a mixer diode is mounted on the ground or image plane of the circuit and situated in a cavity of the image guide. However, this image guide structure proposed by Knox et al has several distinct disadvantages, among which include the difficulty of constructing the Knox et al integrated circuit and further the fact that the physical (dielectric) discontinuity between the mixer diode and the low pass filter of this circuit makes the circuit structure very lossy. Moreover, the particular screw connection disclosed in FIG. 57 of the above Knox et al disclosure is impractical and unreliable from a high volume and high yield manufacturing standpoint.

THE INVENTION

The general purpose of the present invention is to provide new and improved dielectric image guide integrated mixer and detector circuit which is operative to provide highly efficient frequency mixing and detection of microwave and millimeter wave energy, and which possesses both structural and electrical superiority relative to the image guide structure proposed above by Knox et al.

To achieve this purpose, we have constructed an improved dielectric image guide integrated circuit including a ground plane upon which a first image guide section of predetermined height and width is mounted. An image guide transition section is integrally joined to the first image guide section and includes a cavity therein having one transverse dimension, i.e. its input port width, larger than a corresponding transverse dimension of the first image guide section. A mixer or detector diode is mounted in the cavity of the image guide transition section and is operative to either frequency mix or detect millimeter wave energy received from the first image guide section. The transverse dimension of the cavity at the input opening therein for receiving millimeter wave energy is greater than the corresponding width of the joining first image guide section by a predetermined amount related to the fundamental mode of wave propagation in the first image guide section. This insures that millimeter wave energy will be efficiently coupled from the first image guide section into the cavity where it is mixed or detected by the diode. Therefore, the diode is not capacitively loaded by either the first image guide section, or by a second, output image guide section which is joined to the other side of the cavity.

Accordingly, it is an object of the present invention to provide a new and improved dielectric image guide integrated circuit for efficiently mixing or detecting millimeter wave energy.

Another object is to provide an integrated image guide circuit of the type described possessing both structural and electrical characteristics superior to similar state of the art devices known to us.

Another object is to provide a dielectric image guide integrated circuit of the type described which is adapted for use with either low pass or band reject or other metallization filter configurations that can be directly deposited, such as by printing, on the surface of the dielectric image guide.

A further object is to provide a dielectric image guide integrated circuit of the type described which is especially well suited for use with high cutoff frequency Schottky diodes. Such diodes are adapted for metal wisker-like contacts provided by this circuit and are suitable for a variety of millimeter wave frequency applications.

A further object is to provide a millimeter wave integrated circuit for the type described which offers the advantages of low cost and reliability in terms of structural integrity and small size.

These and other objects and features of the invention will become more readily apparent in the following description of the accompanying drawings.

DRAWINGS

FIG. 1b is an elevational view of the integrated structure of FIG. 1a.

FIG. 2a is perspective view of one type of practical integrated circuit embodying the invention.

FIG. 2b is an enlarged sectional view taken along lines b—b of FIG. 2a.

FIG. 2c illustrates the electric field distribution for energy which is propagated down the input image guide section of the above identified figures.

Figure 1A:
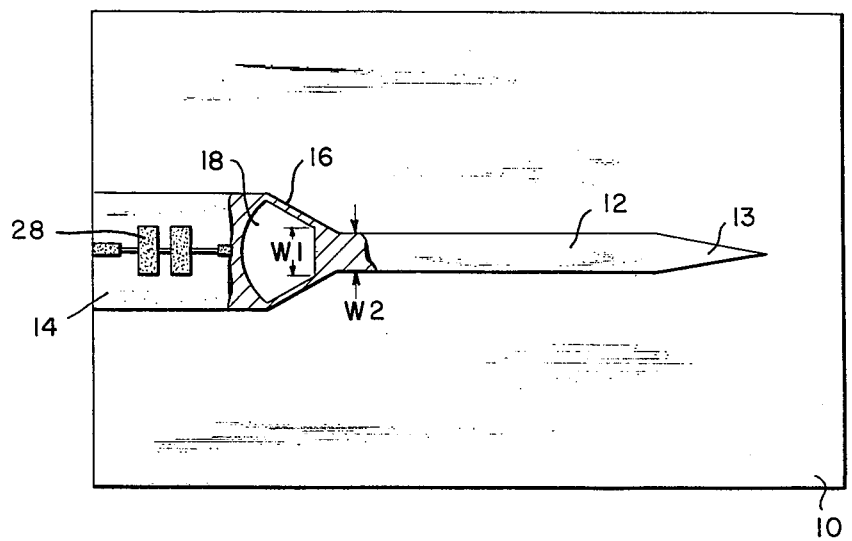
FIG. 1a is a plan view of the integrated image guide structure embodying the invention.
Figure 1B:
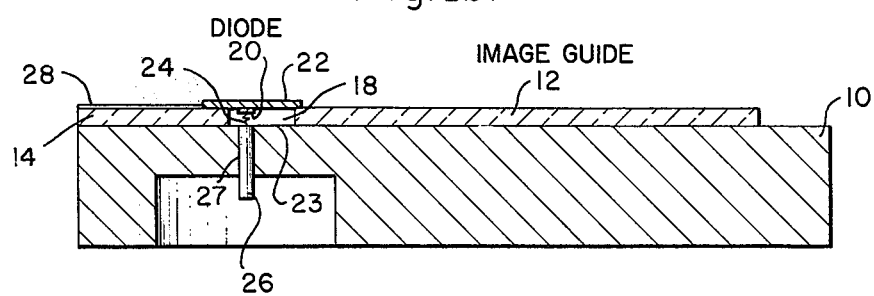

Referring now to FIGS. 1a and 1b, there is shown a metal ground plane 10 of infinite area and it may typically be machined from gold plated brass or from copper or aluminum or other equivalent ground plane metals or metal alloys suitable for use in a dielectric image guide. A first or input image guide section 12 is mounted as shown on the surface of the ground plane 10 and includes a tapered, energy input section 13. The input section 13 of the guide section 12 may advantageously be electromagnetically coupled in a known manner to receive incoming millimeter wave energy from another waveguiding structure of appropriate matching and coupling geometrical and cross-sectional configuration.

A second or output image guide section 14 is coupled to the first or input image guide section 12 by means of an image guide transition section 16 of a variable cross section. Additionally, the image guide transition section 16 has a cavity or opening 18 therein with an energy input port dimension W1 which is greater than the corresponding width dimension W2 of the adjoining first image guide section 12. The exact amount by which these dimensions W1 and W2 vary will, as explained below, depend upon the contour of the fundamental mode of $E_y^{11}$ millimeter wave energy to be propagated in the image guide sections 12, 14, and 16. This contour is in turn dependent upon the frequency of the $E_y^{11}$ energy propagated in the image guide. But the fact that the width dimension W1 of the cavity opening is slightly greater than the width W2 of the input waveguide section 12 insures that there is an efficient coupling of energy from the input image guide section 12 and into the cavity 18 where it may then be mixed or detected by a small semiconductor diode 20. The mixer or detector diode 20 is mounted as shown on the underside of a removable metal cover 22 which provides a complete enclosure for the cavity 18. The cover 22 is spaced apart from a facing predefined area 23 of the ground plane 10 by the height dimension of the input, output and transition image guide transmission sections 12, 14 and 16, respectively.

A suitable DC operating bias for the diode 20 is provided by means of a wisker contact 24 which extends from a larger integral DC bias pin 26 which is press fit into a small cylindrical passage 27 in the ground plane 10. Preferably, the face-down area of the mixer or detector diode 20 is of the well known honeycomb configuration, and has a large plurality of openings therein, any one of which is adapted to receive the tip end of the cat wisker 24. This type of semiconductor diode and its corresponding electrical contact structure is described in further detail, for example, in an article by Harry L. Stover et al entitled "Solid State Devices and Components for Millimeter-Wave Receiver-Transmitter Systems", *The Microwave Journal*, February 1973, pages 35–41.

A low pass filter or a band reject filter or another suitable filtering or impedance matching metallization pattern 28 may advantageously be deposited on the top surface of the output image guide section 14 and may be utilized, for example, for providing a desired filtering action for the millimeter wave energy received from the output port of the cavity 18. It is known in this art that the particular shape of the surface metallization pattern 28 may be related to low pass, band pass or band reject filtering action, so as to provide a desired filtering of the millimeter wave energy which is propagated in the output image guide section 14. It is also known that metallization patterns on the surface of the image guide sections adjacent the cavity 18 may be contoured, as described in our copending application Ser. No. 632,613, to provide an impedance transition region adjacent the diode 20. Such impedance transition region serves to match the relatively high impedance of the image guide sections 12 and 14 remote from the diode 20 to the relatively low impedance of the semiconductor diode 20.

The material from which the image guide sections 12, 14 and 16 are formed may be a dielectric such as aluminum oxide, ($Al_2O_3$), diamond, ceramic, or it may instead be a high resistivity semiconductive material, such as near intrinsic silicon or gallium arsenide.

The cat wisker 24 may advantageously be a gold-nickel alloy for making good electrical contact to the honeycomb surface of the semiconductor diode 20. This honeycomb structure, as noted, includes a large plurality of small openings in the surface oxide thereof which all expose the PN active junction of the diode. It is only necessary that the tip of the cat wisker 14 extend into any one of these openings to make good electrical contact to the PN junction.

As is known in the art, the dielectric image guide sections 12, 14 and 16 have a cross-sectional area suitable for efficiently sustaining the propagation of the $E_y^{11}$ mode of wave propagation which corresponds to the $TE_{10}$ waveguide mode of propagation in waveguide structures. Furthermore, it is also known that for this fundamental $E_y^{11}$ mode of wave propagation in the dielectric image guide, the aspect ratio, or the height-to-width ratio of the cross-sectional area of the image guide sections 12 and 14 is approximately 2. But as mentioned above, the exact height and width of the image guide sections 12, 14, and 16 can be set at either side of this aspect ratio of 2 in accordance with a particular frequency range of interest within the overall millimeter wave frequency range of 30 to 300 GHz.

Referring now to FIGS. 2a and 2b, there is shown one practical arrangement that we have used for coupling microwave or millimeter wave energy into the input or first wave transmission section 12 of our image guide integrated circuit. This approach involves the use of a C-shaped image guide oscillator circuit section 30 of the same material as the image guide sections 12, 14 and 16 and includes an IMPATT diode 32 connected and appropriately biased at one end of the oscillator section 30 and a termination element 34 at the other end of section 30. The termination element 34 provides a means of dissipation for the microwave energy which is not coupled through the region 36 and into the first waveguide section 12 of our mixer/detector circuit. The C-shaped oscillator circuit section 30 is only illustrated schematically in FIG. 2a, and in practice the IMPATT diode 32 is actually mounted directly on the surface of the ground plane 10 and is electrically coupled to the adjoining C-shaped waveguide material by using the ribbon coupling (not shown) which is disclosed and claimed in our copending application Ser. No. 632,613 identified above. Additionally, the termination element 34 may advantageously take the form of a rectangular thin film, as indicated in FIG. 2a, which may be deposited as indicated on the top of the C-shaped waveguide member. The film 34 is a lossy material, such as a ferrite, and is used to dissipate power which is propagated to the end of the oscillator circuit upon which the film 34 is mounted. Such power dissipation techniques are well-known in the art.

As is also known and understood in this art (and is disclosed in some detail in the above-identified Marcatili article entitled "Dielectric Rectangular Waveguide and Directional Coupler for Integrated Optics," *The Bell System Technical Journal*, September 1969), the amount of power coupled between the waveguide 30 and the adjacent waveguide section 12 can be controlled by varying the dimensions of the lengths D and L as indicated in FIG. 2a. For 3db coupling between these two waveguide sections, one-half of the power from the IMPATT diode 32 will be coupled into the waveguide section 12, and the other half of the power generated by this IMPATT diode will be dissipated by the termination element 34.

Referring now to FIGS. 2b and 2c, the exact shape of the mixing or detecting cavity 18 is shown in detail and includes an input port 38 having a width dimension as wide and preferably slightly wider than the width dimension of the input waveguide section 12. That is, in FIG. 2b the dimension ½ W1 is slightly greater than the dimension ½ W2. Preferably, the width ½ W1 should be greater than ½ W2 by an amount at least equal to the lateral extent outside the guide section 12 over which the $E_Y^{11}$ vector extends from one side thereof. That is, it is well-known that the fundamental mode $E_Y^{11}$ energy distribution pattern for microwave or millimeter wave energy propagated down a section of rectangular waveguide resembles a bell-shaped type of curve which peaks at the top center point 40 of the waveguide cross-section 12, as indicated in FIG. 2c, but which in fact extends slightly outside the confines of this cross-sectional area. For this reason, for optimum wave transmission efficiency the input width dimension W1 of the opening for cavity 18 should preferably be at least equal to or greater than the actual distribution width W3 of the $E_Y^{11}$ energy distribution pattern of FIG. 2c.

Output power from our mixer/detector circuit described above may be coupled from the output waveguide section 14 by a conventional coaxial transmission line whose inner conductor 42 is electrically joined to a flat output probe 44 which is simply an extension of the film 28 of metallization of our mixer and detector circuit. The inner and outer conductors 42 and 46, respectively, of the coaxial line shown in FIG. 2b are preferably mounted as shown in a sturdy housing member 48 which adjoins and may also support the metal ground plane 10 for our microwave integrated circuit. Conductors 42 and 46 of the output coaxial line are, of course, separated by an appropriate cylindrical dielectric material 50.

The following parameters apply to one embodiment of our invention, as illustrated in FIG. 2a, which has been actually reduced to practice.

EXAMPLE

The waveguide sections 12, 14 and 16 were constructed of high resistivity silicon having a height of about 0.050 inches, and in width (W2) of the input section 12 was about 0.100 inches, whereas the width of the output section 14 was about 0.200 inches. The high resistivity silicon sections 12, 14 and 16 of waveguide were affixed to the ground plane 10 using an epoxy glue, and the output filter 28 was formed on section 14 by first appropriately masking the output section 14 and then depositing successive layers of chromium and gold to form this filter 28 in the particular geometrical configuration shown.

The input frequency of the energy coupled into the image guide section 12 was measured at 60 GHz and the output frequency of energy coupled from the image guide section 14 into the coaxial line was measured at 1 MHz. The mixer diode 20 was a conventional Schottky barrier mixer diode, and the conversion loss for this operation was measured at 8*db*, whereas (and most significantly) the local oscillator noise suppression was measured at 30*db*.

What is claimed is:
1. An image guide integrated circuit including, in combination:
   a. a metallic ground plane,
   b. an image guide wave transmission section of predetermined height and width mounted on said ground plane,
   c. an image guide transition section joined to said transmission section and having a cavity therein with one transverse dimension larger than the width of said transmission section by an amount related to the fundamental mode of wave propagation within said transmission section, and
   d. a diode mounted in said cavity for providing mixing or detection of microwave or millimeter wave energy received from said image guide transmission section, whereby microwave or millimeter energy will be efficiently coupled from said image guide transmission section into said cavity, and said diode is not capacitively loaded by said image guide transmission or transition sections.

2. The combination defined in claim 1 which further includes a second image guide transmission section of a cross-sectional area different from that of the first named image guide transmission section, and joined to said image guide transition section for coupling power out of said cavity.

structure defined in claim 2 wherein said cavity in said image guide transition section has an opening therein receiving a cover upon which said diode is mounted, and said cover is spaced apart from said ground plane by the height dimension of said image guide transmission and transition sections.

4. The structure defined in claim 3 which further includes a passage in said ground plane receiving a bias pin and cat wisker extending therefrom into electrical contact with said diode, whereby said bias pin may be securely press fit into said passage in said ground plane.

5. The structure defined in claim 4 which further includes a preconfigured filter or impedance matching metallization deposited on the upper surface of said second image guide transmission section for providing desired filtering or impedance matching for energy passing into said second image guide transmission section.

6. An image integrated circuit including, in combination:

a metallic ground plane,
an image guide wave transmission section of predetermined height and width mounted on said ground plane,
an image guide transition section joined to said transmission section and having a cavity therein with an opening which is wider than the width of said transmission section, and d. a diode mounted in said cavity for providing mixing or detection of microwave or millimeter wave energy received from said image guide transmission section.

7. The combination defined in claim 6 which further includes a second image guide transmission section of a cross-sectional area different from that of the first named image guide transmission section, and joined to said image guide transition section for coupling power out of said cavity.

8. The structure defined in claim 7 wherein said cavity in said image guide transition section has an opening therein receiving a cover upon which said diode is mounted, and said cover is spaced apart from said ground plane by the height dimension of said image guide transmission and transition sections.

9. The structure defined in claim 8 which further includes a passage in said ground plane receiving a bias pin and cat wisker extending therefrom into electrical contact with said diode, whereby said bias pin may be securely press fit into said passage in said ground plane.

10. The structure defined in claim 9 which further includes a preconfigured filter or impedance matching metallization deposited on the upper surface of said second image guide transmission section of a desired filtering or impedance matching.